United States Patent
Ishii et al.

(10) Patent No.: US 8,618,813 B2
(45) Date of Patent: Dec. 31, 2013

(54) CIRCUIT FAULT DETECTING DEVICE AND METHOD

(75) Inventors: Shigeki Ishii, Tokyo (JP); Satoru Yamagishi, Tokyo (JP)

(73) Assignee: Azbil Corporation, Tokyo (JP)

( * ) Notice: Subject to any disclaimer, the term of this patent is extended or adjusted under 35 U.S.C. 154(b) by 491 days.

(21) Appl. No.: 12/958,019

(22) Filed: Dec. 1, 2010

(65) Prior Publication Data

US 2011/0163759 A1 Jul. 7, 2011

(30) Foreign Application Priority Data

Jan. 6, 2010 (JP) ................. 2010-001319

(51) Int. Cl.
*G01R 31/02* (2006.01)
*H01H 31/12* (2006.01)

(52) U.S. Cl.
USPC ........................................ 324/541; 324/551

(58) Field of Classification Search
USPC ................................................. 324/551, 541
See application file for complete search history.

(56) References Cited

U.S. PATENT DOCUMENTS

| | | | |
|---|---|---|---|
| 5,768,077 A | 6/1998 | Futsuhara et al. | |
| 5,973,896 A | 10/1999 | Hirsh et al. | |
| 6,392,422 B1* | 5/2002 | Kammer et al. | 324/650 |
| 6,593,767 B1 | 7/2003 | Tanaka et al. | |
| 7,253,639 B2 | 8/2007 | Horikoshi et al. | |
| 8,144,440 B2* | 3/2012 | Aoki | 361/42 |
| 2006/0158197 A1 | 7/2006 | Horikoshi et al. | |
| 2010/0131215 A1* | 5/2010 | Kim | 702/58 |

FOREIGN PATENT DOCUMENTS

| | | |
|---|---|---|
| CN | 1289050 A | 3/2001 |
| CN | 1819412 A | 8/2006 |
| EP | 0787996 A1 | 8/1997 |
| EP | 1089080 A1 | 4/2001 |
| JP | 9-33595 A | 2/1997 |
| JP | 2009-168404 A | 7/2009 |
| WO | 98/24161 A1 | 6/1998 |

OTHER PUBLICATIONS

European Search Report, dated Jan. 18, 2013, which issued during the prosecution of European Patent Application No. 11150189.6, which corresponds to the present application.

Chinese Office Action, dated Feb. 18, 2013, which issued during the prosecution of Chinese Patent Application No. 201010585060.6, which corresponds to the present application.

\* cited by examiner

*Primary Examiner* — Amy He

(74) *Attorney, Agent, or Firm* — Troutman Sanders LLP

(57) ABSTRACT

To detect accurately an insulation fault in a load circuit, Power supply lines and an electric heater (a load circuit) are connected by a detecting portion to detect a detected voltage (detected value) in accordance with the magnitude of a leakage current Id that flows through a ground between the power supply lines and the electric heater, and an evaluation as to whether or not there is a breakdown of insulation of the electric heater relative to the ground is performed by an evaluating portion based on the detected value obtained when the relay contact points are open.

2 Claims, 5 Drawing Sheets

CIRCUIT FAULT DETECTING DEVICE AND METHOD

CROSS REFERENCE TO RELATED APPLICATIONS

The present application claims priority under 35 U.S.C. §119 to Japanese Patent Application No. 2010-001319, filed Jan. 6, 2010, which is incorporated herein by reference.

FIELD OF TECHNOLOGY

The present invention relates to a circuit fault detecting technology and, in particular, to a technology for detecting a fault in a circuit that provides a power supply to a load circuit through a relay.

BACKGROUND OF THE INVENTION

In devices for providing power through a relay contact point to a load circuit, such as an electric heater, one major circuit fault type is the welding of the relay contact point. For example, in a floor panel heating system that controls the supply of power to a floor heating panel that contains an electric heater, the supply of power to the electric heater is controlled in order to obtain the target temperature in the floor heating panel through controlling the relay contact point based on the temperature of the surface of the floor heating panel. Consequently, if there is welding of the relay contact point due to, for example, breakdown of the contact point, then it will be necessary to stop the supply of power to the electric heater, and necessary to detect accurately this type of circuit fault.

Conventionally, there have been proposals for a technology, as a technology for detecting this type of circuit fault, for detecting welding of the relay contact point through detecting, using a photocoupler, whether or not there is leakage current that flows in the relay contact point in a state wherein the relay contact points are open, doing so by connecting the photocoupler to both sides of the relay contact point. (See, for example, Japanese Unexamined Patent Application Publication 2009-168404.)

However, in this type of conventional technology, relay faults have been detected as one type of circuit fault, and there has been a problem in that it has not been possible to perform detection accurately for an insulation fault in the load circuit.

For example, in a floor heating panel system, when the floor heating panel is installed there may be inadequate insulation resistance between the electric heater and the ground voltage (the earth), due to, for example, damage to the electric heater that occurs during the installation work, precluding electrical safety. Because of this, it is necessary to detect with accuracy insulation faults in the load circuit.

The present invention is to solve this type of problem, and the object thereof is to provide a circuit fault detecting technology able to detect accurately an insulation fault in a load circuit.

SUMMARY OF THE INVENTION

In order to achieve such an object, the circuit fault detecting device according to the present invention, for detecting a fault in a load circuit that is supplied power from a power supply line through two relay contact points that are provided respectively in each of a pair of power supply lines, includes a detecting portion, connected between power supply lines and a load circuit, for detecting a detected value in accordance with a magnitude of a leakage current that flows through a ground between the power supply line and the load circuit; and an evaluating portion for evaluating whether or not there is a breakdown of the insulation of the load circuit, relative to ground, based on the detected value obtained when the relay contact points are open.

At this time, the evaluating portion may compare the detected value, obtained when the relay contact points are open, to a threshold value that indicates the detected value obtained when the insulation resistance of the load circuit, relative to a ground, has dropped to a lower limit value of a normal range, and may evaluate whether or not there is a breakdown of insulation in a load circuit in accordance with the comparison results.

The evaluating portion may calculate a difference value between a detected value that is obtained when the relay contact points are open and a detected value that is obtained when the relay contact points are closed, and may compare to a difference threshold value that indicates a difference value between a detected value when the relay contact points are open, obtained when the insulation resistance of the load circuit, relative to a ground, has fallen to a lower limit value of a normal range, and a detected value obtained when the relay contact points are closed, and may evaluate whether or not there is a breakdown of insulation in a load circuit in accordance with the comparison results.

Additional, the circuit fault detecting method according to the present invention, for detecting a fault in a load circuit that is supplied power from a power supply line through two relay contact points that are provided respectively in each of a pair of power supply lines has a detecting step, connected between power supply lines and a load circuit, for detecting a detected value in accordance with a magnitude of a leakage current that flows through a ground between the power supply line and the load circuit; and an evaluating step for evaluating whether or not there is a breakdown of the insulation of the load circuit, relative to ground, based on the detected value obtained when the relay contact points are open.

At this time, the evaluating step may compare the detected value, obtained when the relay contact points are open, to a threshold value that indicates the detected value obtained when the insulation resistance of the load circuit, relative to a ground, has dropped to a lower limit value of a normal range, and may evaluate whether or not there is a breakdown of insulation in a load circuit in accordance with the comparison results.

The evaluating step may calculate a difference value between a detected value that is obtained when the relay contact points are open and a detected value that is obtained when the relay contact points are closed, and may compare to a difference threshold value that indicates a difference value between a detected value when the relay contact points are open, obtained when the insulation resistance of the load circuit, relative to a ground, has fallen to a lower limit value of a normal range, and a detected value obtained when the relay contact points are closed, and may evaluate whether or not there is a breakdown of insulation in a load circuit in accordance with the comparison results.

The present invention enables accurate detection of an insulation fault between a load circuit and a ground for a load circuit that is supplied with power of a power supply line through two relay contact points that that are provided respectively in each of a pair of power supply lines.

DETAILED DESCRIPTION OF THE INVENTION

Examples are explained next in reference to the drawings.

Figure 1:
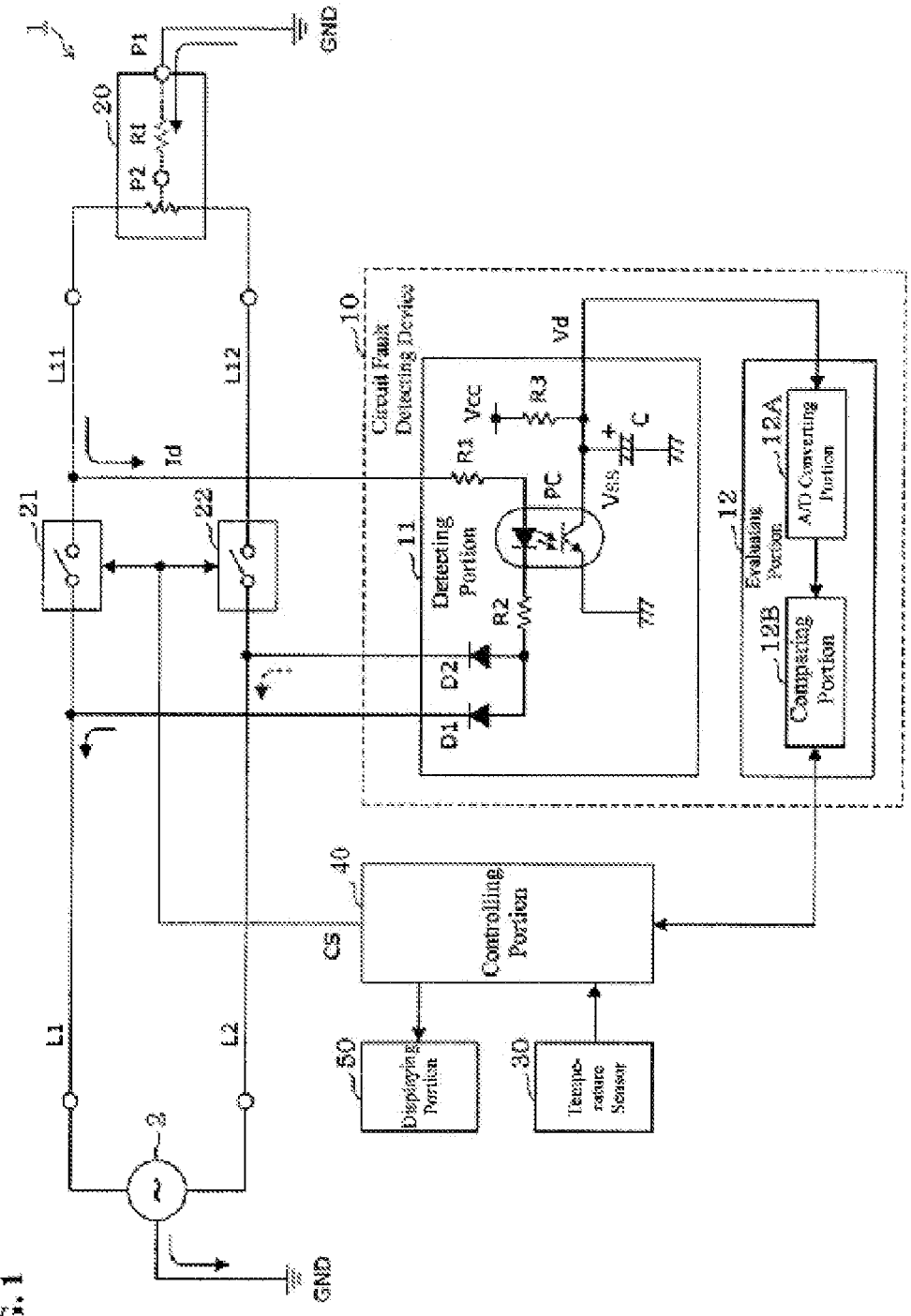
FIG. 1 is a block diagram illustrating the structure of a circuit fault detecting device according to an example.

A circuit fault detecting device according to an example of the present invention is explained in reference to FIG. 1. FIG. 1 is a block diagram illustrating the structure of the circuit fault detecting device according to the example.

This circuit fault detecting device 10 is a device for detecting a fault in a load circuit that is supplied power of a power supply line through two relay contact points equipped respectively in each of a pair of power supply lines.

A floor panel heating system 1 is an example wherein this circuit fault detecting device is applied. The floor panel heating system 1 is equipped with the circuit fault detecting device 10, an electric heater 20, relay contact points 21 and 22, a temperature sensor 30, a controlling portion 40, and a displaying portion 50, as the primary functional portions thereof.

The electric heater 20 corresponds to the load circuit of the circuit fault detecting device 10, and is installed in the floor of a room, built into a floor heating panel. The relay contact points 21 and 22 are equipped respectively in each of a pair of power supply lines L1 and L2, which provide AC power from art alternating current power supply 2, and perform closing/opening operations based on a control signal CS from the controlling portion 40.

The controlling portion 40 controls the relay contact points 21 and 22 by the control signal CS based on the temperature of the surface of the floor heating panel, measured by the temperature sensor 30, to maintain the floor heating panel at a target temperature through controlling the supply of the AC power to the electric heater 20. The displaying portion 50 displays the detail of the control by the controlling portion 40 using a display device such as an LED or LCD.

The circuit fault detecting device 10 in the example is provided between the power supply lines L1 and L2 and the electric heater 20, to detect a detected voltage Vd as a detected value in accordance with the magnitude of the leakage current Id that flows through the ground GND between the power supply lines L1 and L2 and the electric heater 20, where the evaluation of whether or not there is a breakdown in insulation of the electric heater 20 relative to the ground GND is performed based on the detected voltage Vd obtained when the relay contact points 21 and 22 are open.

Figure 2:
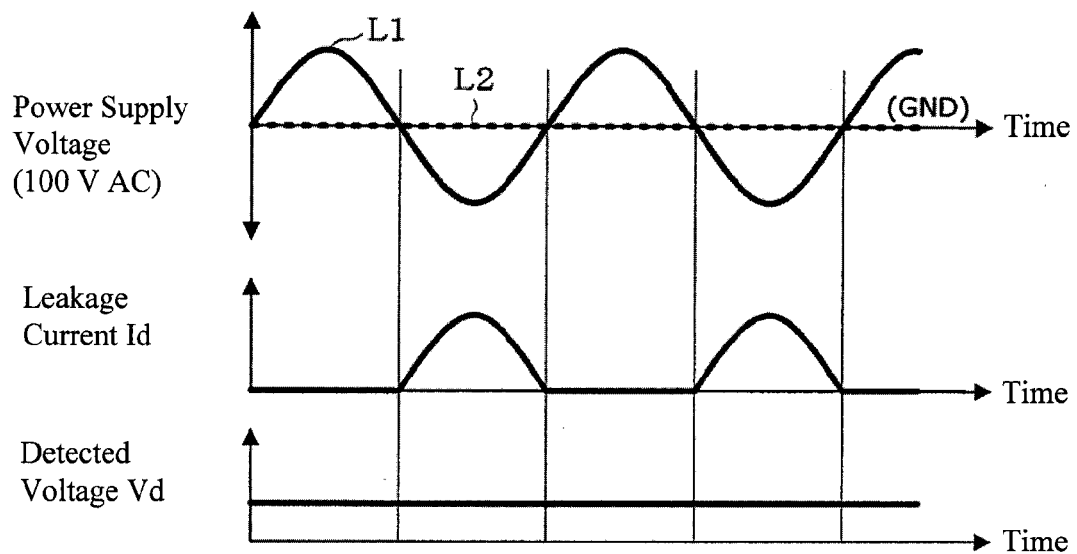
FIG. 2 is a signal waveform diagram illustrating leakage current at 100 V AC
Figure 3:
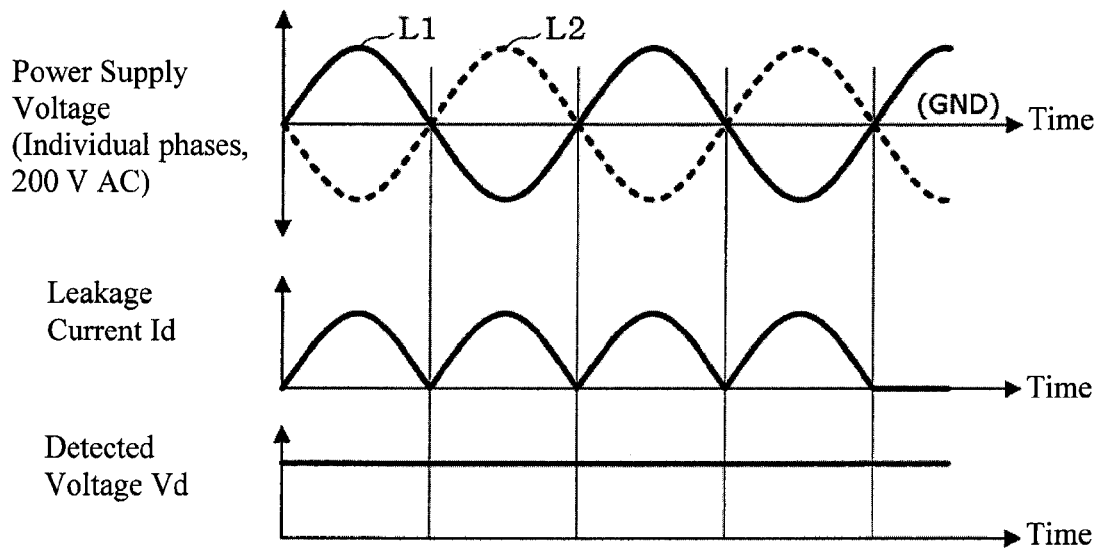
FIG. 3 is a signal waveform diagram illustrating leakage current in individual phases of 200 V AC.

The principle behind the present invention is explained next in reference to FIG. 2 and FIG. 3. FIG. 2 is a signal waveform diagram illustrating the leakage current at 100 V AC. FIG. 3 is a signal waveform diagram illustrating the leakage current at individual phases of 200 V AC.

In the floor panel heating system 1 in FIG. 1, the insulation resistance RI between the ground and the electric heater 20 is normally in the order of megaohms, and if this is reduced, then a leakage current Id will be produced through the ground GND between the power supply lines L1 and L2 and the electric heater 20.

As illustrated in FIG. 2, if 100 V AC is supplied to the power supply lines L1 and L2, then one of the power supply lines L1 or L2, for example, the power supply line L2, can be at a voltage that is essentially equal to the ground GND, and the voltage of the other power supply line L1 can alternate between positive and negative relative to this voltage.

Consequently, the power supply line L2 and one side P1 of the insulation resistance RI can both be at the same voltage as the ground GND, and thus, during the period wherein the relay contact points 21 and 22 are open, a voltage difference can be produced between the power supply line L1 and the other side P2 of the insulation resistance RI, in accordance with the alternating current amplitude of the 100 V AC.

Because of this, when, for example, there is a path L11 on the electric heater side 20 from the relay contact point 21, then, as illustrated in FIG. 1, the leakage current Id flows through the ground GND, through the alternating current power supply 2→the ground GND→the insulation resistance RI→the electric heater 20→the path L11→the circuit fault detecting device 10→the power supply line L1→the alternating current power supply 2. The same is true for the case wherein there is a path L12 from the relay contact point 22 on the electric heater 20 side.

Here the leakage current Id that flows between the power supply line L1 and the other side P2 of the insulation resistance RI is a value in accordance with the insulation resistance RI. Specifically, given the detecting portion 11 in FIG. 1, if the power supply voltage is defined as Vp, then the leakage current Id and the insulation resistance RI have the relationship Id=Vp/(R1+R2+RI). In this case, the amount of voltage drop in the diode of a photocoupler PC and in the diodes D1 and D2 can be ignored as being small relative to the power supply voltage Vp. The example focuses on this point, to evaluate whether or not there is a reduction in the insulation resistance RI, or in other words, whether or not there is a breakdown in the insulation of the electric heater 20 relative to the ground GND, through detecting the magnitude of this leakage current Id.

Since the resistance of the electric heater 20 is very small as compared with the insulation resistance RI, the leakage current Id may be detected between the path L11 or the path L12 (it is between the relay contact points 21 or 22 and the electric heater 20) and the power supply lines L1, rather than the other side P2 of the insulation resistance RI.

Additionally, because the leakage current Id is an alternating current, detecting and integrating either one of the leakage currents Id that have been rectified by the diodes D1 and D2 enables stabilized detection of the detected voltage Vd that indicates a voltage in accordance with the magnitude of the leakage current Id.

Furthermore, as illustrated in FIG. 3, when individual phases of AC 200 V are connected to the power supply lines L1 and L2, the voltage in the middle between the power supply lines L1 and L2 will be the ground GND, and thus the voltages of the power supply lines L1 and L2 will change to positive and negative with opposite phases relative to the ground GND.

Consequently, because the power supply line L2 and one side P1 of the insulation resistance RI are both at the same voltage as the ground GND, in the interval wherein the relay contact points 21 and 22 are open, a voltage difference that is in accordance with the alternating current amplitude of the individual phases of the 200 V AC will be produced between the power supply line L1 and the other side P2 of the insulation resistance RI, and between the power supply line L2 and the other side P2 of the insulation resistance RI.

Because of this, as with 100 V AC, it is possible to evaluate whether or not there is a drop in the insulation resistance RI, that is, whether or not there is a breakdown in insulation of the electric heater 20 relative to the ground GND, through detecting the magnitude of the leakage current Id.

At this time, the leakage currents Id will be alternating currents produced with opposite phases for the power supply lines L1 and L2, making it possible to obtain a full wave leakage current Id by performing current rectification, with respective diodes, for the power supply lines L1 and L2.

Circuit Fault Detecting Device

The structure of the circuit fault detecting device 10 according to the present example is explained in detail next in reference to FIG. 1.

The circuit fault detecting device 10 is provided with a detecting portion 11 and an evaluating portion 12 as the primary functional portions thereof.

The detecting portion 11 is connected between the power supply lines L1 and L2 and the electric heater 20, and has the function of detecting the detected voltage Vd as a detected value in accordance with the magnitude of the leakage current Id that flows through the ground GND between the power supply lines L1 and L2 and the electric heater 20.

The evaluating portion 12 has the function of evaluating whether or not there is a breakdown in insulation of the electric heater 20 relative to the ground GND, based on the detected voltage Vd obtained from the detecting portion 11 when the relay contact points 21 and 22 are open.

The detecting portion 11 is provided with: a resistive element R1 having one end thereof connected to the path L11 and the other end thereof connected to an anode terminal of a diode of a photocoupler PC; a resistive element R2 having one end thereof connected to a cathode terminal of the diode of the photocoupler PC; a diode D1 having the cathode thereof connected to the path L1 and the anode thereof connected to the other end of the resistive element R2; and a diode D2 having the cathode thereof connected to a path L2 and the anode thereof connected to the other end of the resistive element R2.

Additionally, the detecting portion 11 is provided with: a photocoupler PC having an anode terminal of a diode connected to the other end of the resistive element R1, a cathode terminal of the diode connected to one end of the resistive element R2, and an emitter terminal of a phototransistor connected to a reference voltage Vss; a resistive element R3 having one end connected to a power supply voltage Vcc and the other end connected to a collector terminal of the phototransistor of the photocoupler PC; and a capacitive element C having one end connected to a collector terminal of the phototransistor of the photocoupler PC and the other end connected to the reference voltage Vss.

Consequently, when the power supply line L2 is at a voltage that is equal to the ground GND and the voltage of the power supply line L1 is less than that voltage, the leakage current Id will flow from the ground GND through the insulation resistance RI→the electric heater 20→the path L11 the resistive element RI→the diode of the photocoupler PC→the diode D1, to the power supply line L1.

Because of this, the photo transistor of the photocoupler PC will turn ON in accordance with the leakage current Id, and the detected voltage Vd that is produced across the capacitive element C will fall from the power supply voltage Vcc towards the reference voltage Vss in accordance with the magnitude of the leakage current Id.

The evaluating portion 12 is provided with an A/D converting portion 12A and a comparing portion 1213, as the primary functional portions thereof.

The A/D converting portion 12A has the function of performing A/D conversion of the detected voltage Vd in accordance with the magnitude of the leakage current Id detected by the detecting portion 11.

The comparing portion 12B has the function of comparing the detected voltage Vd, obtained when the relay contact points 21 and 22 are open, to a threshold value Vth that indicates the detected voltage obtained when the insulation resistance RI of the electric heater 20 relative to the ground GND has fallen to a lower limit value RIth, to determine, in accordance with the comparison result, whether or not there is a breakdown of the insulation of the electric heater, and a function for providing notification of the evaluation result to a controlling portion 40. Notification is received from the controlling portion 40 over the interval wherein the relay contact points 21 and 22 are open.

Figure 4:
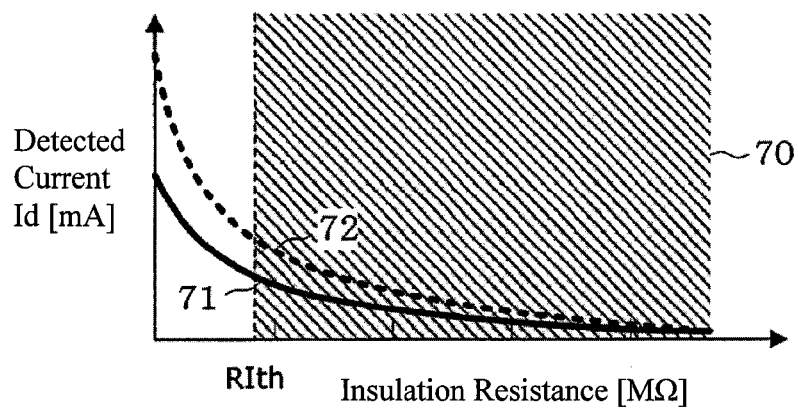
FIG. 4 is a graph illustrating the relationship between the insulation resistance and the leakage current.
Figure 5:
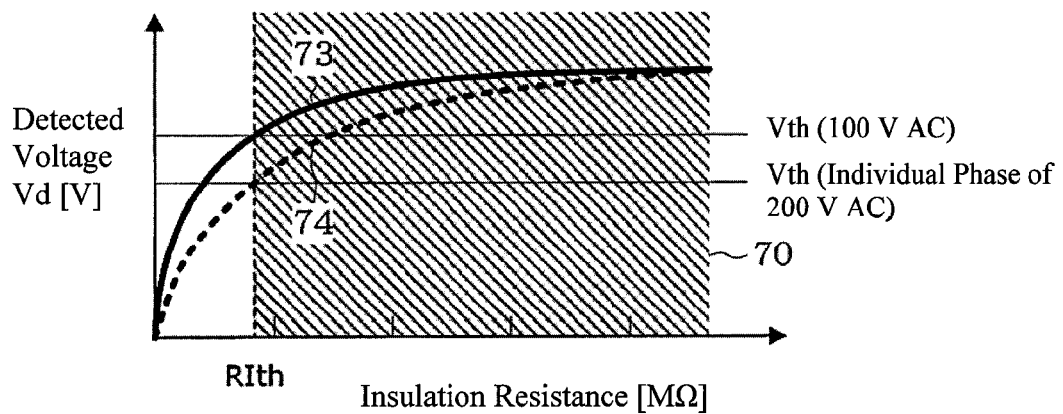
FIG. 5 is a graph illustrating the relationship between the insulation resistance and the detected voltage.

FIG. 4 is a graphic illustrating the relationship between the insulation resistance and the leakage current. FIG. 5 is a graph illustrating the relationship between the insulation resistance and the detected voltage.

As illustrated in FIG. 4, the leakage current Id increases monotonically as the resistance value of the insulation resistance RI is reduced, In FIG. 4, the characteristic 71 indicates the case wherein the alternating current power supply 2 is 100 V AC, and the characteristic 72 indicates a case wherein the alternating current power supply 2 is individual phases of 200 V AC. Additionally, as illustrated in FIG. 5, the detected voltage Vd obtained by the detecting portion 11 falls monotonically as the resistance value of the installation resistance RI is reduced. In FIG. 5, the characteristic 73 indicates a case wherein the alternating current power supply 2 is 100 V AC, and the characteristic 74 indicates a case wherein the alternating current power supply 2 is individual phases of 200 V AC.

The lower limit value RIth indicates the lower limit value of the normal range 70 of the values that a non-defective insulation state may assume, of the values that may be assumed by the insulation resistance RI, or in other words, indicates the threshold for evaluating whether or not the installation has a fault, where if the insulation resistance RI falls below the lower limit value RIth, then the evaluation is that an insulation fault has occurred in the electric heater 20.

The threshold value Vth is the threshold value for evaluating whether or not there is a fault in the insulation resistance RI based on this type of lower limit value RIth, indicating the detected value, that is, the value of the detected voltage Vd, that is obtained by the detecting portion 11 when the insulation resistance RI has reached the lower limit value RIth.

As is illustrated in FIG. 5, at this time there are different characteristics 73 and 74, for the case wherein the alternating current power supply 2 is 100 V AC or the case wherein the alternating current power supply 2 is individual phases of 200 V AC, so the threshold values Vth will also be different. Consequently, when there is the possibility that either the 100 V AC or the individual phases of 200 V AC will be used for the alternating current power supply 2, then which of these is used as the alternating current power supply 2 may be inputted into the comparing portion 12B, and the threshold value Vth may be switched in accordance with this input.

In the case of the floor panel heating system 1 of FIG. 1, something with this power supply evaluating function may be used as the power supply circuit (not shown) for generating the operating power for each of the circuits, from the power supply lines L1 and L2, where the power supply evaluation result may be inputted into the controlling portion 40, and this power supply evaluation result may be inputted into the comparing portion 12B.

While these A/D converting portion 12A and comparing portion 12B may be structured using dedicated electronic circuits, they may instead be structured from a CPU having an A/D converting function. Furthermore, this CPU may be structured from the CPU that is used as the controlling portion 40.

Figure 6:
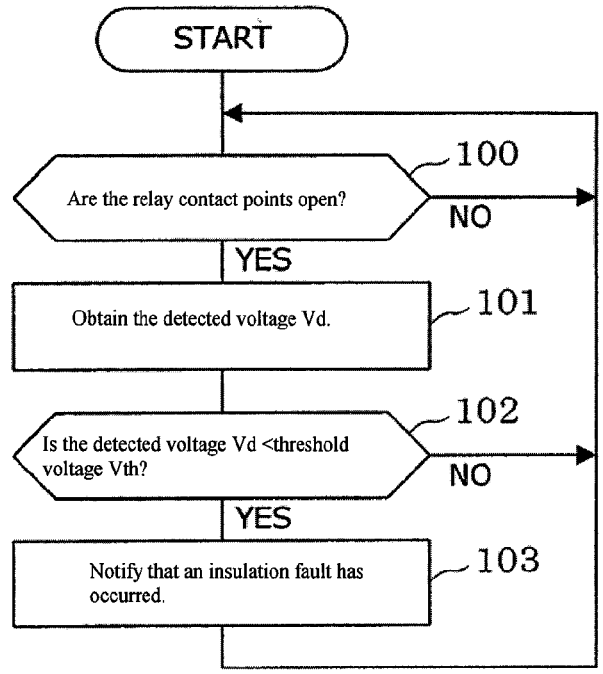
FIG. 6 is a flowchart illustrating the fault evaluating operation of the circuit fault detecting device according to an example.

The operation of the circuit fault detecting device 10 according to an example is explained next in reference to FIG. 6. FIG. 6 is a flowchart illustrating the fault evaluating operation of the circuit fault detecting device according to example.

Here 100 V AC is supplied from the alternating current power supply 2 to the power supply lines the L1 and L2, where a voltage that is equal to the ground GND is supplied to the power supply line L2 thereof.

In this detecting portion 11, normally the photocoupler PC operates in accordance with the leakage current Id that flows from the path L11 through the resistive element R1, and a detected voltage Vd that indicates a detected value in accordance with the magnitude of the leakage current Id is accumulated in a capacitive element C.

The A/D converting portion 12A of the evaluating portion 12 receives the detected voltage Vd, obtained by the detecting portion 11, and performs A/D conversion, to output to the comparing portion 12B the detected voltage data obtained thereby.

The comparing portion 12B determine the intervals over which the relay contact points 21 and 22 are open, in accordance with a notification from the controlling portion 40 (Step 100), and if during an interval wherein the relay contact points 21 and 22 are open (Step 100: YES), then detected voltage data is obtained periodically from the A/D converting portion 12A (Step 101), and compared against the threshold voltage Vth, set in advance (Step 102).

If at this point the detected voltage data is less than the threshold value Vth (Step 102: YES), then the comparing portion 12B provides notification of the occurrence of the insulation fault to the controlling portion 40 (Step 103). As a result, the controlling portion 40 displays a warning on the displaying portion 50 that an insulation fault with the ground GND has occurred in the electric heater 20. After Step 103, processing returns to Step 100, to perform the evaluation for a new detected voltage.

Additionally, if the detected voltage data is greater than or equal to the threshold value Vth (Step 102: NO), then processing returns to Step 100, and an evaluation is performed on a new detected voltage.

In this way, in the present example, the evaluating portion 12 is able to detect accurately whether or not there is a fault in the electric heater through enabling an evaluation of whether or not there is a breakdown of insulation of the electric heater 20 relative to the ground GND based on the detected value when the relay contact points 21 and 22 are open, by connecting a detecting portion 11 between the power supply lines L1 and L2 and the electric heater (the load circuit) 20, to detect a detected voltage Vd (detected value) by the detecting portion 11 in accordance with the magnitude of a leakage current Id that flows through the ground GND between the power supply lines L1 and L2 and the electric heater 20.

Additionally, in the present example, the detected value (detected voltage Vd) obtain when the relay contact points 21 and 22 are open is compared by the evaluating portion 12 to a threshold value Vth that indicates the detected value obtained when the insulation resistance RI of the electric heater 20 relative to the ground GND has reached a lower limit value of the normal range, where an evaluation is performed as to whether or not there is a breakdown in insulation of the electric heater 20 in accordance with the comparison result thereof, thus enabling high precision detection, using a simple circuit structure, of whether or not there is an insulation fault in the electric heater 20.

A circuit fault detecting device according to another example is explained next.

In the above example, the explanation was for an example wherein, in the evaluating portion 12, an evaluation was performed as to whether or not there is an insulation fault based on a detected voltage Vd that is detected by the detecting portion 11 when the relay contact points 21 and 22 are open. In the present example, the explanation is for the case wherein the evaluation as to whether or not there is an insulation fault is performed based on a difference value between two detected voltages Vd obtained when the relay contact points 21 and 22 are open and when they are closed.

As illustrated in FIG. 5, described above, when the lower limit value RIth of the normal range is small when compared to the insulation resistance RI, then the detected voltage Vd obtained when the insulation resistance RI has fallen to the neighborhood of the lower limit value RIth will also be small. Because of this, there is a large variability component of the detected voltage Vd, depending on factors other than the insulation resistance RI, such as, for example, the variability in the alternating current power supply 2 or the temperature characteristics of the photocoupler PC. Consequently, it becomes difficult to evaluate accurately whether or not there is an insulation fault through comparing the detected voltage Vd, which includes the large variability component, to the threshold value Vth, which is set to be a constant.

This type of variability in the detected voltage Vd is produced not only when the relay contact points 21 and 22 are open, but also similarly in the detected voltage Vd when the relay contact points 21 and 22 are closed. In the present example, the evaluation of whether or not there is a breakdown in insulation is performed through comparing a difference value ΔVd to a corresponding difference threshold value ΔVdth, focusing on the fact that it is possible to cancel out the variability component included in detected voltages Vdoff and Vdon through calculating the difference value ΔVd between two detected voltages Vdoff and Vdon when the relay contact points 21 and 22 are open and when they are closed.

The comparing portion 12B in the present example has a function for calculating a difference value ΔVd=Vdoff−Vdon between the detected voltage Vdoff obtained when the relay contact points 21 and 22 are open and the detected voltage Vdon obtained when the relay contact points 21 and 22 are closed, and a function for comparing this difference value ΔVd to a difference threshold value ΔVth indicating the difference value ΔVd that is obtained when the insulation resistance RI of the electric heater 20 relative to the ground GND has fallen to the lower threshold value RIth of the normal range, to evaluate whether or not there is a breakdown in insulation in the electric heater in accordance with the comparison result. The intervals over which the relay contact points 21 and 22 are open and closed are obtained through notification from the controlling portion 40.

Figure 7:
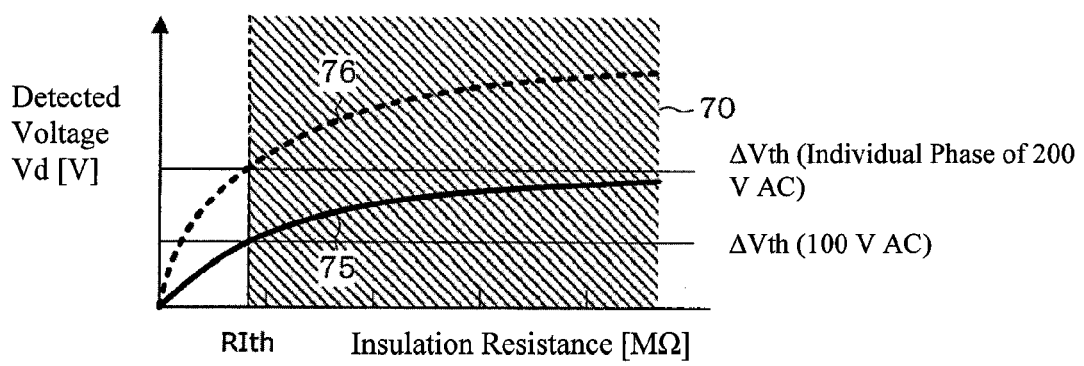
FIG. 7 is a graph illustrating the relationship between the insulation resistance and the detected voltage difference value.

FIG. 7 is a graph illustrating the relationship between the insulation resistance and the detected voltage difference value. As illustrated in FIG. 7, the difference value ΔVd of the detected voltages Vd obtained by the detecting portion 11 fall monotonically as the resistance value of the insulation resistance RI is reduced. In FIG. 6, characteristic 75 illustrates the case wherein the alternating current power supply 2 is 100 V AC, and characteristic 76 illustrates the case wherein the alternating current power supply 2 is individual phases of 200 V AC.

The lower limit value RIth indicates the lower limit value of the normal range 70 of the values that a non-defective insulation state may assume, of the values that may be assumed by the insulation resistance RI, or in other words, indicates the threshold for evaluating whether or not the installation has a fault, where if the insulation resistance RI falls below the lower limit value RIth, then the evaluation is that an insulation fault has occurred in the electric heater 20. The difference threshold value $\Delta$Vth is the threshold value for evaluating whether or not there is a fault in the insulation resistance RI based on this type of lower limit value RIth, indicating the difference value $\Delta$Vt calculated from the detected voltages Vd that are obtained by the detecting portion 11 when the insulation resistance RI has reached the lower limit value RIth.

As is illustrated in FIG. 7, at this time there are different characteristics 75 and 76, for the case wherein the alternating current power supply 2 is 100 V AC or the case wherein the alternating current power supply 2 is individual phases of 200 V AC, so the difference threshold values $\Delta$Vth will also be different. Consequently, when there is the possibility that either the 100 V AC or the individual phases of 200 V AC can be used for the alternating current power supply 2, then which of these is used as the alternating current power supply 2 may be inputted into the comparing portion 12B, and the difference threshold value $\Delta$Vth may be switched in accordance with this input.

Figure 8:
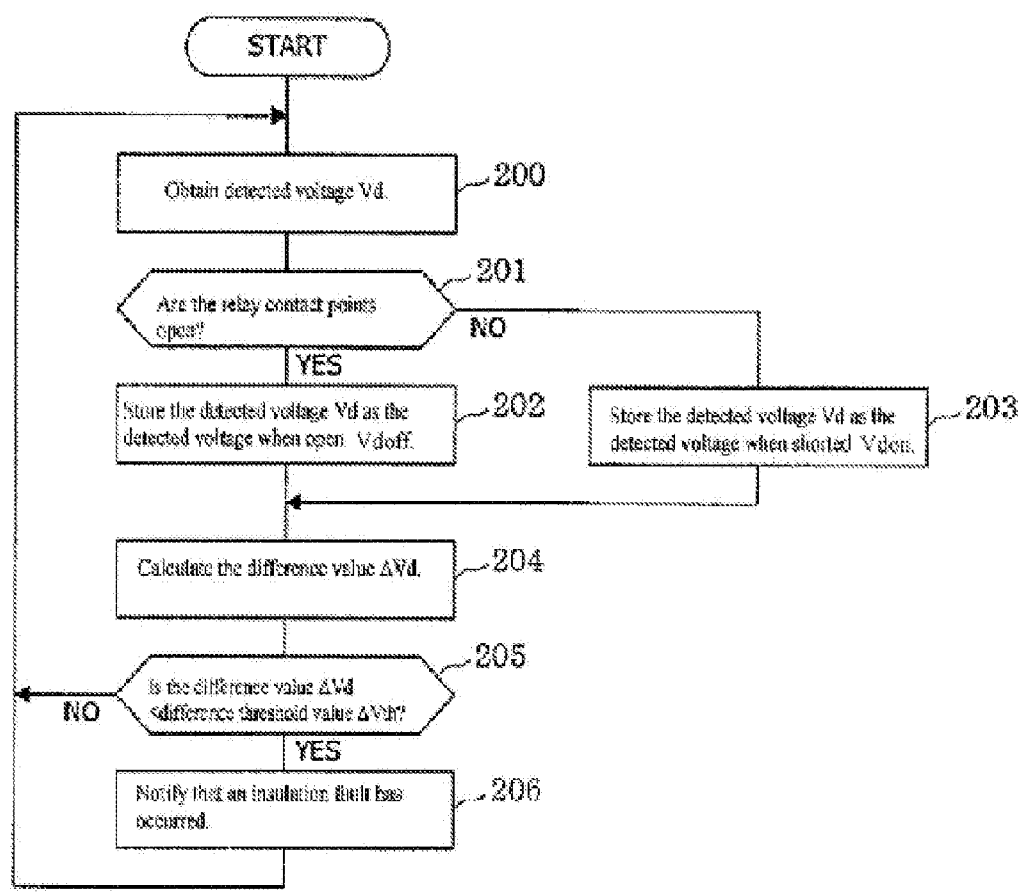
FIG. 8 is a flowchart illustrating the fault evaluating operation of the circuit fault detecting device according to another example.

The operation of the circuit fault detecting device 10 according to another example is explained next in reference to FIG. 8. FIG. 8 is a flowchart illustrating the fault evaluating operation of the circuit fault detecting device according to this example. Here 100 V AC is supplied from the alternating current power supply 2 to the power supply lines the L1 and L2, where a voltage that is equal to the ground GND is supplied to the power supply line L2 thereof.

In this power supply portion 11, normally the photocoupler PC operates in accordance with the leakage current Id that flows from the path L11 through the resistive element RI, and a detected voltage Vd that indicates a detected value in accordance with the magnitude of the leakage current Id is accumulated in a capacitive element C. The A/D converting portion 12A of the evaluating portion 12 receives the detected voltage Vd, obtained by the detecting portion 11, and performs A/D conversion, to output to the comparing portion 12B the detected voltage data obtained thereby. The comparing portion 12B obtains detected value data periodically from the A/D converting portion 12A (Step 200), and determines the interval over which the relay contact points 21 and 22 are open, in accordance with a notification from the controlling portion 40 (Step 201). If this point is while the relay contact points 21 and 22 are open (Step 201: YES), then the detected voltage data that is obtained is stored to a storing portion (not shown) as detected voltage data (when open) Vdoff (Step 202).

On the other hand, if it is during an interval wherein the relay contact points 21 and 22 are closed (Step 201: NO), then the detected voltage data that is obtained is stored to the storing portion as detected voltage data (when closed) Vdon (Step 203).

Thereafter, the comparing portion 12B reads out, from the storing portion, the detected voltage data (when open) Vdoff and the detected voltage data (when closed) Vdon, and calculates the difference value $\Delta$Vd of these detected voltage data. (Step 204), and compares against the difference threshold value Vth that has been set in advance (Step 205).

If at this point the difference value $\Delta$Vd is less than the difference threshold value $\Delta$Vth (Step 205: YES), then the comparing portion 12B provides notification of the occurrence of the insulation fault to the controlling portion 40 (Step 206). As a result, the controlling portion 40 displays a warning on the displaying portion 50 that an insulation fault with the ground GND has occurred in the electric heater 20. After Step 206, processing returns to Step 200, to perform the evaluation for a new detected voltage. Additionally, if the difference value $\Delta$Vd is greater than or equal to the difference threshold value $\Delta$Vth (Step 205: NO), then processing returns to Step 200, and an evaluation is performed on a new detected voltage.

In this way, in the present example the difference value $\Delta$Vd between the detected voltage (detected value) Vdon obtained when the relay contact points 21 and 22 are closed and the detected voltage (detected value) Vdoff when the relay contact points 21 and 22 are open is calculated by the evaluating portion 12, and compared to the difference threshold value $\Delta$Vth that indicates the difference value between the detected voltage Vdon obtained when the relay contact points 21 and 22 are closed and the detected voltage Vdoff when the relay contact points 21 and 22 are open, obtained when the insulation resistance RI of the electric heater 20 relative to the ground GND has fallen to the lower limit value RIth of the normal range, to evaluate whether or not there is a breakdown in insulation of the electric heater 20 in accordance with the comparison result.

Consequently, both the detected voltage Vdoff when the relay contact points 21 and 22 are open and the detected voltage Vdon when the relay contact points 21 and 22 are closed are included, making it possible to reduce, through calculating both difference values Vd, the variability component due to factors other than the insulation resistance RI, such as variability in the alternating current power supply 2 and the temperature characteristics of the photocoupler PC. Because of this, it is possible to evaluate accurately whether or not there is an insulation fault, even when the lower limit value RIth of the normal range is small relative to the insulation resistance RI.

While the present invention was explained above in reference to examples, the present invention is not limited to the examples set forth above. The structures and details of the present invention can be modified in a variety of ways, as can be understood by those skilled in the art, within the scope of the present invention.

While in the various examples set forth above the explanation was for cases wherein an evaluation was performed as to whether or not there is an insulation fault in an electric heater (a load circuit) 20 in the evaluating portion 12 of the circuit fault detecting device 10, instead the evaluation may be performed as to whether or not there is welding of a relay contact point 21 or 22.

In FIG. 1, if either of the relay contact points 21 or 22 has welded due to, for example, the breakdown of a contact point, then a leakage current Id flows relative to the detecting portion 11 of the circuit fault detecting device 10 when the relay contact points 21 and 22 are supposed to be open.

For example, if the relay contact point 21 is welded, then the power supply line L2 will be at a voltage that is equal to the ground GND, and if the voltage of the power supply line L1 is higher than this voltage, the leakage current id flows through the power supply line L1→the relay contact point 21→the path L1→the resistive element R1→the diode of the photocoupler PC→the diode D2, to the power supply line L2. Additionally, if, for example, the relay contact point 22 is welded, then the power supply line L2 is at a voltage equal to the ground GND, and if the voltage of the power supply line L1 is lower than this voltage, then the leakage current id flows through the power supply line L2→the relay contact point 22→the path L12→the electric heater 20→the path L11→the resistive element R1→the diode of the photocoupler PC→the diode D1, to the power supply line L1.

Here the leakage current Id due to the welding of the relay contact point 21 or 22 in this way can be extremely large in comparison with the leakage current Id due to an insulation fault of the electric heater 20 as explained above, and has a magnitude that is essentially the same as the leakage current Id when the relay contact points 21 and 22 are connected.

Because of this, in the detecting portion 11, a detected voltage Vd that is smaller than the threshold value Vth for evaluating the insulation fault, about the same as the state wherein the value of the insulation resistance RI in the aforementioned FIG. 5 is about zero, will be obtained.

Consequently, in the case of one example, it is possible to evaluate the occurrence of welding in the relay contact points 21 and 22 when the detected voltage Vd is less than the threshold value for evaluating welding Vrth by setting independently a threshold value for evaluating welding Vrth, being a voltage value that is less than the threshold value for evaluating an insulation fault Vth and then, for example, after Step 102: NO in FIG. 6, having the evaluating portion 12 compare with the detected voltage (detected value) Vd obtained by the detecting portion 11 when the relay contact points 21 and 22 are open. Doing so makes it possible to detect not only an insulation fault in the electric heater 20, but also the welding of a relay contacts point 21 or 22.

Additionally, in the case of the other example, a difference value ΔVd that is less than the difference value for evaluating the insulation fault ΔVth, that is about the same as the state wherein the insulation resistance RI in the aforementioned FIG. 7 is essentially zero, is obtained.

Consequently, it is possible to evaluate the occurrence of welding in the relay contact points 21 and 22 when the difference value ΔVd is less than the difference threshold value for evaluating welding ΔVrth by setting independently a difference threshold value for evaluating welding ΔVrth, being a difference voltage value that is less than the difference threshold value for evaluating an insulation fault ΔVth and then, for example, after Step 205: NO in FIG. 8, having the evaluating portion 12 compare with the difference value ΔVd obtained by the detecting portion 11 when the relay contact points 21 and 22 are open. Doing so makes it possible to detect not only an insulation fault in the electric heater 20, but also the welding of a relay contacts point 21 or 22.

The invention claimed is:

1. A circuit fault detecting device for detecting a fault in a load circuit that is supplied power from a power supply line through two relay contact points that are provided respectively in each of a pair of power supply lines, the circuit fault detecting device comprising:
   a detecting portion, connected between power supply lines and a load circuit, detecting a detected value in accordance with a magnitude of a leakage current that flows through a ground between the power supply line and the load circuit; and
   an evaluating portion evaluating whether or not there is a breakdown of the insulation of the load circuit, relative to ground, based on the detected value obtained when the relay contact points are open, wherein:
   the evaluating portion calculates a difference value between a detected value that is obtained when the relay contact points are open and a detected value that is obtained when the relay contact points are closed, compares to a difference threshold value that indicates a difference value between a detected value when the relay contact points are open, obtained when the insulation resistance of the load circuit, relative to a ground, has fallen to a lower limit value of a normal range, and a detected value obtained when the relay contact points are closed, and evaluates whether or not there is a breakdown of insulation in a load circuit in accordance with the comparison results.

2. A circuit fault detecting method for detecting a fault in a load circuit that is supplied power from a power supply line through two relay contact points that are provided respectively in each of a pair of power supply lines, comprising the steps of:
   a detecting step detecting a detected value in accordance with a magnitude of a leakage current that flows through a ground between the power supply line and the load circuit; and
   an evaluating step evaluating whether or not there is a breakdown of the insulation of the load circuit, relative to ground, based on the detected value obtained when the relay contact points are open, wherein
   the evaluating step calculates a difference value between a detected value that is obtained when the relay contact points are open and a detected value that is obtained when the relay contact points are closed, compares to a difference threshold value that indicates a difference value between a detected value when the relay contact points are open, obtained when the insulation resistance of the load circuit, relative to a ground, has fallen to a lower limit value of a normal range, and a detected value obtained when the relay contact points are closed, and evaluates whether or not there is a breakdown of insulation in a load circuit in accordance with the comparison results.

* * * * *